(12) United States Patent
Sato (10) Patent No.: US 10,856,444 B2
(45) Date of Patent: Dec. 1, 2020

(54) COOLING DEVICE AND ELECTRONIC APPARATUS

(71) Applicant: FUJITSU LIMITED, Kawasaki-shi, Kanagawa (JP)

(72) Inventor: Yoichi Sato, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/396,812

(22) Filed: Apr. 29, 2019

(65) Prior Publication Data

US 2019/0357388 A1    Nov. 21, 2019

(30) Foreign Application Priority Data

May 18, 2018    (JP) ................ 2018-096033

(51) Int. Cl.
*H05K 7/20* (2006.01)
*F28F 3/04* (2006.01)
*G06F 1/20* (2006.01)

(52) U.S. Cl.
CPC .......... *H05K 7/20409* (2013.01); *F28F 3/04* (2013.01); *G06F 1/20* (2013.01); *H05K 7/20163* (2013.01); *F28F 2215/04* (2013.01)

(58) Field of Classification Search
CPC .......... H05K 7/20409; H05K 7/20163; H05K 7/20727; H05K 7/20136–20163; F28F 3/04; F28F 2215/04; G06F 1/20; F28D 2021/0029; H01L 23/3672; H01L 23/467; H01L 23/34; H01L 23/367–3677
USPC ...... 361/679.47, 679.54, 702, 709, 695–697, 361/679.48–679.51; 165/80.2–80.3
See application file for complete search history.

(56) References Cited

U.S. PATENT DOCUMENTS

| 5,422,787 | A | * | 6/1995 | Gourdine | H05K 7/20154 361/695 |
| 5,563,768 | A | * | 10/1996 | Perdue | H01L 23/467 165/80.3 |
| 5,576,932 | A | * | 11/1996 | Bishop | H01L 23/467 165/80.3 |
| 5,763,950 | A | * | 6/1998 | Fujisaki | H01L 23/3672 165/80.3 |
| 6,940,716 | B1 | * | 9/2005 | Korinsky | G06F 1/20 165/121 |
| 7,492,599 | B1 | * | 2/2009 | Yu | F21K 9/00 165/185 |

(Continued)

FOREIGN PATENT DOCUMENTS

| JP | 05-095062 | 4/1993 |
| JP | 2007-013052 | 1/2007 |

*Primary Examiner* — Stephen S Sul
(74) *Attorney, Agent, or Firm* — Fujitsu Patent Center (57) ABSTRACT

A cooling device includes a heat reception base configured to receive heat transmitted from an electronic component. The cooling device also include a fin base configured to face the heat reception base. The fin base is also configured to form a ventilation path through which air flows between the fin base and the heat reception base. A heat conductor coupled with the heat reception base and the fin base is also included. The cooling device also includes a plurality of radiation fins configured to extend from the fin base to a side opposite to the heat reception base. The fin base includes an air outlet configured to communicate with a gap between the radiation fins adjacent to each other.

17 Claims, 11 Drawing Sheets

(56) References Cited

U.S. PATENT DOCUMENTS

| | | | |
|---|---|---|---|
| 8,199,500 B2 * | 6/2012 | Yamagiwa | H05K 7/20127 |
| | | | 361/692 |
| 2003/0218850 A1 * | 11/2003 | Kubo | G06F 1/20 |
| | | | 361/103 |
| 2007/0000650 A1 | 1/2007 | Nishimura | |
| 2010/0020498 A1 * | 1/2010 | Urai | H01L 23/40 |
| | | | 361/707 |
| 2010/0139904 A1 * | 6/2010 | Chiba | H01L 21/4878 |
| | | | 165/185 |
| 2012/0152495 A1 * | 6/2012 | Tan | F28F 3/12 |
| | | | 165/104.19 |
| 2014/0151010 A1 * | 6/2014 | Nichols | F28F 3/02 |
| | | | 165/185 |
| 2017/0083058 A1 * | 3/2017 | Janak | G06F 1/20 |
| 2017/0221793 A1 * | 8/2017 | Smalley | H01L 23/427 |
| 2017/0352605 A1 * | 12/2017 | Bilan | F21K 9/23 |

* cited by examiner

COOLING DEVICE AND ELECTRONIC APPARATUS

CROSS-REFERENCE TO RELATED APPLICATION

This application is based upon and claims the benefit of priority of the prior Japanese Patent Application No. 2018-96033, filed on May 18, 2018, the entire contents of which are incorporated herein by reference.

FIELD

The technology disclosed in the application is related to a cooling device and an electronic apparatus.

BACKGROUND

There is a heat sink that cools an electronic component (for example, refer to Japanese Laid-open Patent Publication No. 2007-13052 and Japanese Laid-open Patent Publication No. 05-95062). This type of heat sink is provided with, for example, a case to be brought into contact with the electronic component, a plurality of radiation fins arranged in the case, and a blower that supplies cooling air into the case and cools the radiation fins.

SUMMARY

According to an aspect of the embodiments, a cooling device includes a heat reception base configured to receive heat transmitted from an electronic component, a fin base configured to face the heat reception base, and to form a ventilation path through which air flows between the fin base and the heat reception base, a heat conductor coupled with the heat reception base and the fin base, and a plurality of radiation fins configured to extend from the fin base to a side opposite to the heat reception base, wherein the fin base includes an air outlet configured to communicate with a gap between the radiation fins adjacent to each other.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

In a heat sink of the related art, it is difficult to supply cooling air to each of the plurality of radiation fins, and there is a possibility that heat radiation efficiency of the plurality of the radiation fins is lowered.

Hereinafter, an embodiment of a technique capable of enhancing the heat radiation efficiency of the plurality of the radiation fins will be described.

Cooling Device

Figure 1:
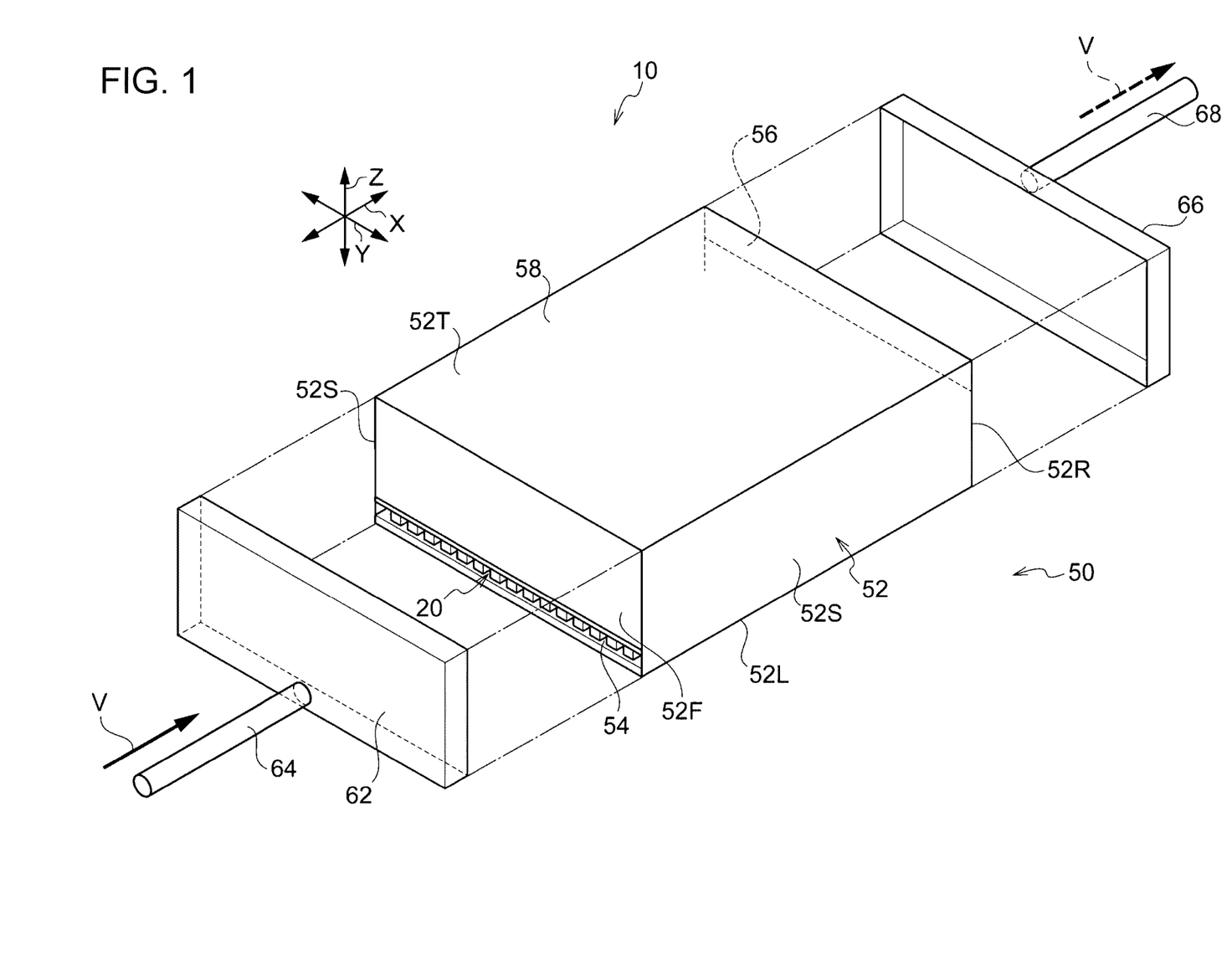
FIG. 1 is a perspective view illustrating a cooling device according to one embodiment.
Figure 2:
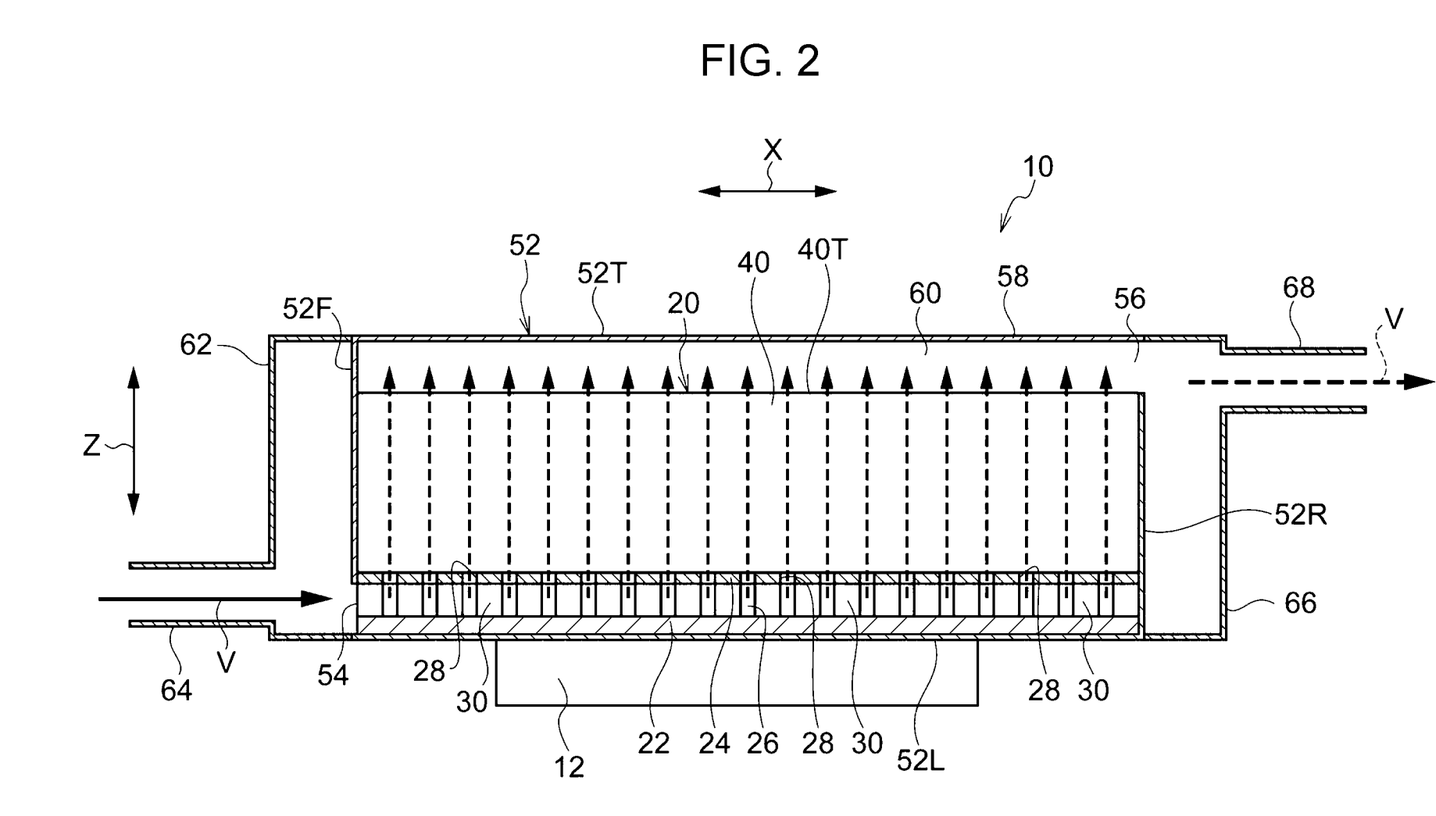
FIG. 2 is a longitudinal sectional view of the cooling device illustrated in FIG. 1.

In FIGS. 1 and 2, a cooling device 10 according to the present embodiment is illustrated. The cooling device 10 is, for example, an air-cooling type cooling device which is attached to an electronic component 12 (refer to FIG. 2) such as a central processing unit (CPU) that generates heat and accelerates heat radiation of the electronic component 12 to cool the electronic component 12. The cooling device 10 includes a heat sink 20, a case 50, and a high static pressure air generator (not illustrated).

Heat Sink

Figure 3:
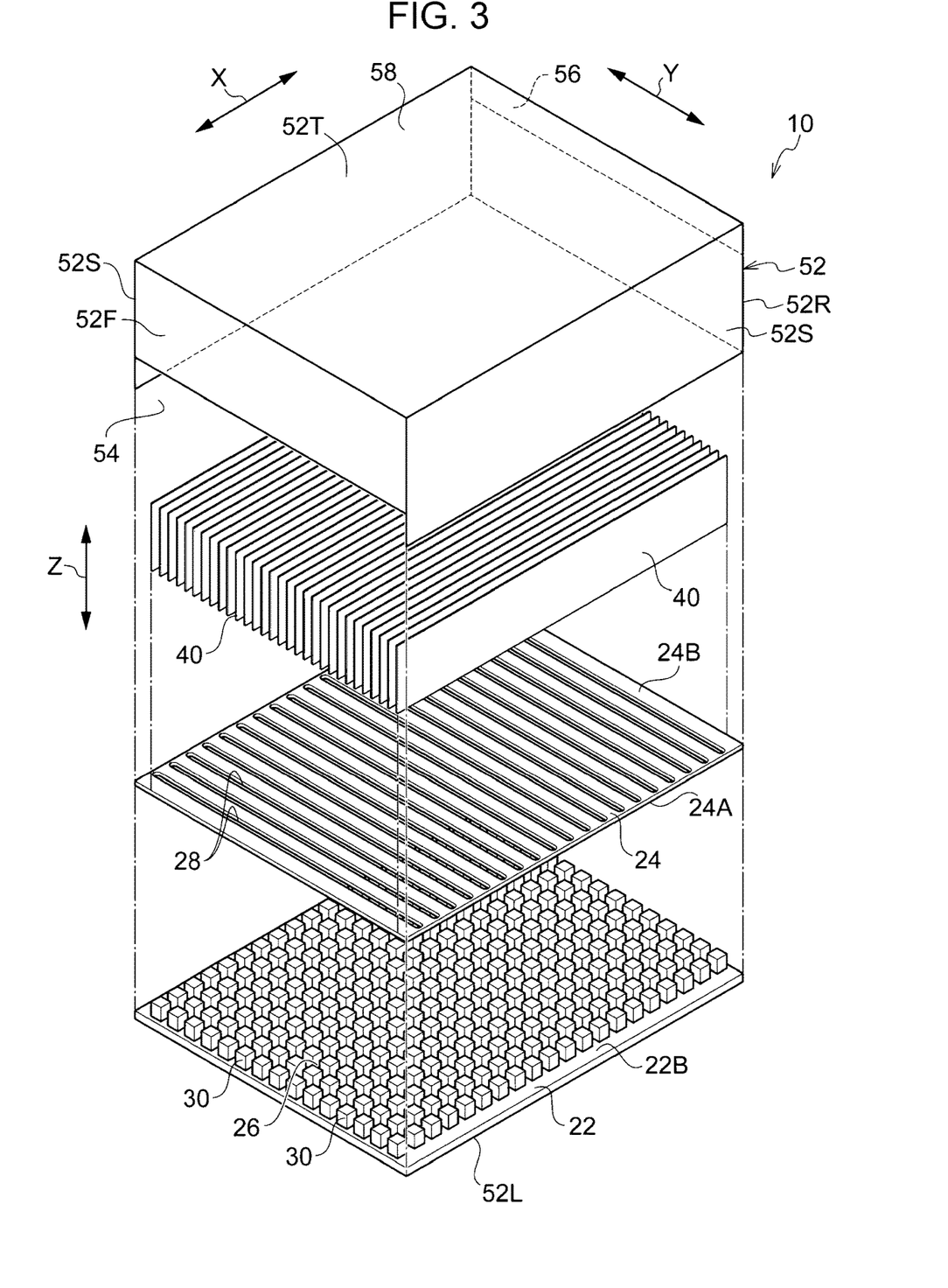
FIG. 3 is an exploded perspective view of the cooling device illustrated in FIG. 1.

As illustrated in FIG. 3, the cooling device 10 (heat sink 20) is provided with a heat receiving base portion 22, a fin base portion 24, a plurality of heat conduction portions 30, and a plurality of radiation fins 40. The heat receiving base portion 22, the fin base portion 24, the plurality of the heat conduction portions 30, and the plurality of the radiation fins 40 are formed of a metal having thermal conductivity such as aluminum and copper, for example.

Arrows X illustrated in each drawing indicates a lateral width direction of the cooling device 10 (heat sink 20). Arrow Y indicates a longitudinal width direction of the cooling device 10 (heat sink 20). Arrow Z indicates a height direction of the cooling device 10 (heat sink 20).

Heat Receiving Base Portion

The heat receiving base portion 22 is formed in a rectangular plate shape. The heat receiving base portion 22 is attached to the electronic component 12 (illustrated in FIG. 2) in a state capable of exchanging heat with the electronic component 12. The heat receiving base portion 22 includes an outer surface 22A (illustrated in FIG. 5) on the electronic component 12 side and an inner surface 22B on a side opposite to the electronic component 12 (on fin base portion 24 side).

Fin Base Portion

The fin base portion 24 is formed in a rectangular plate shape. The fin base portion 24 has the same shape and size as the heat receiving base portion 22. The fin base portion 24 is disposed on the side opposite to the electronic component 12 with respect to the heat receiving base portion 22. The fin base portion 24 includes an inner surface 24A on the heat receiving base portion 22 side and an outer surface 24B on the side opposite to the heat receiving base portion 22 (on radiation fin 40 side).

The shapes and sizes of the fin base portion 24 and the heat receiving base portion 22 may be different from each other.

As illustrated in FIG. 2, the fin base portion 24 is disposed to face the heat receiving base portion 22 in the height direction of the heat sink 20 (direction of arrow Z). For example, the fin base portion 24 and the heat receiving base portion 22 are disposed with a space (gap) in the height direction of the heat sink 20. As a result, a ventilation path (ventilation chamber) 26 is formed between the inner surface 24A of the fin base portion 24 and the inner surface 22B of the heat receiving base portion 22. Cooling air V is supplied to the ventilation path 26 from a high static pressure air generator 94 (illustrated in FIGS. 9-11) to be described later.

A solid arrow V appropriately illustrated in each drawing indicates the cooling air before heat exchange with the heat sink 20. On the other hand, a dotted arrow V indicates the cooling air with increased temperature due to the heat exchange with the heat sink 20.

Figure 4:
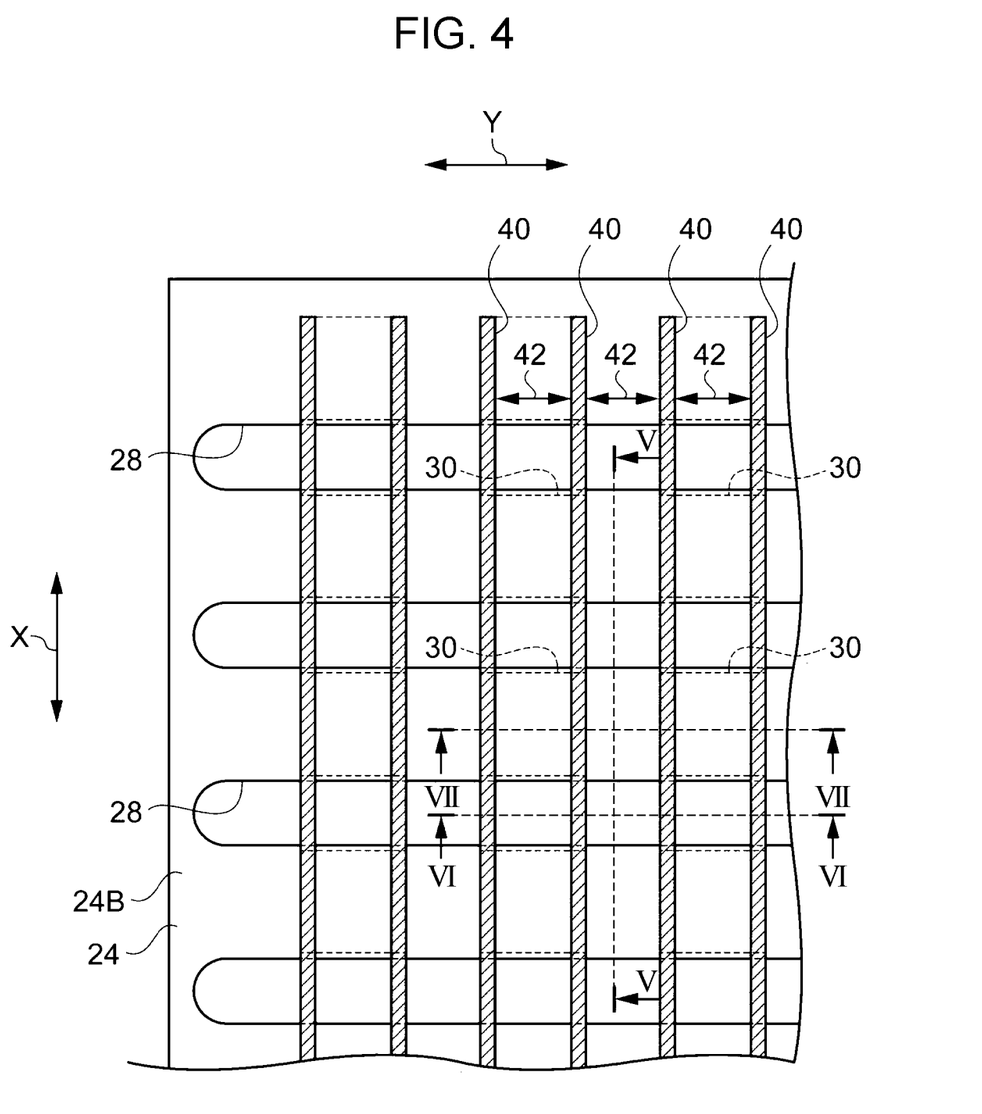
FIG. 4 is a plan view illustrating a fin base portion illustrated in FIG. 3.
Figure 5:
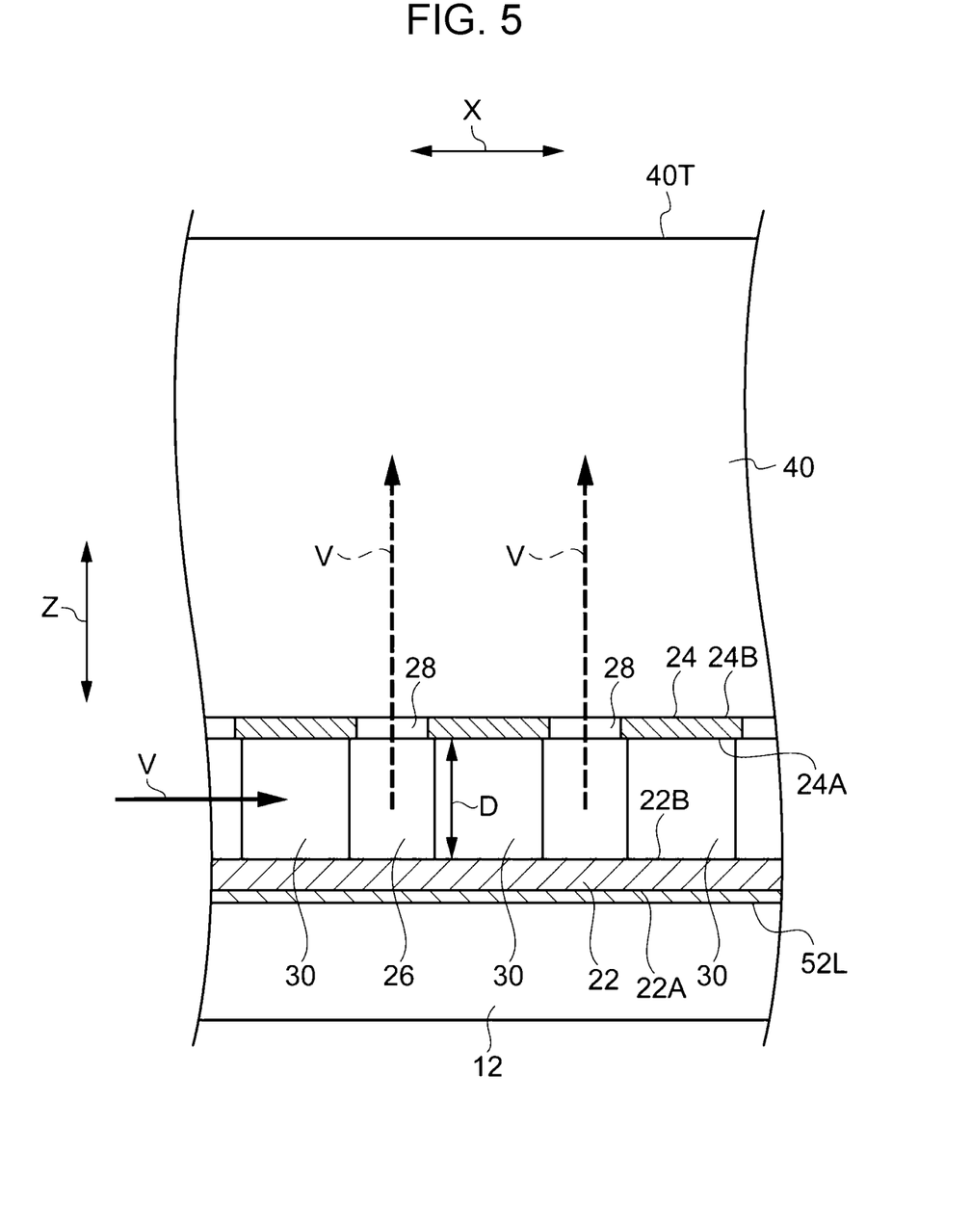
FIG. 5 is a cross-sectional view taken along line V-V of FIG. 4.
Figure 6:
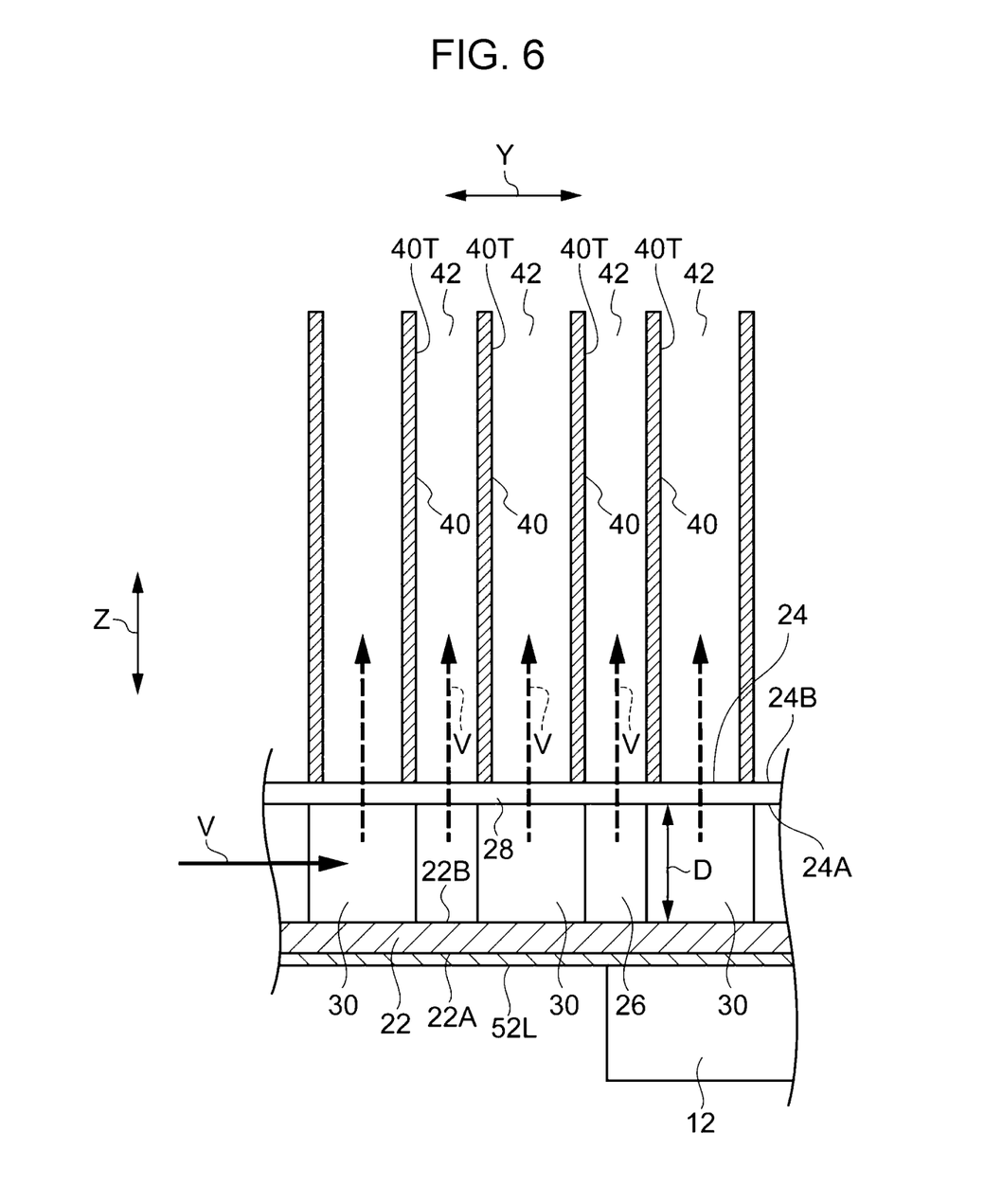
FIG. 6 is a cross-sectional view taken along line VI-VI of FIG. 4.

As illustrated in FIGS. 4, 5, and 6, the fin base portion 24 includes a plurality of air outlets 28 communicating with the ventilation path 26. The plurality of the air outlets 28 are through-holes that penetrate the fin base portion 24 in the thickness direction.

As illustrated in FIG. 4, the plurality of the air outlets 28 are formed in an elongated hole shape (slit shape) extending in the longitudinal width direction (arrow Y direction) of the fin base portion 24. Each of the air outlets 28 is formed from one end side to the other end side in the longitudinal width direction of the fin base portion 24. The air outlets 28 are arranged at equal intervals in the lateral width direction of the heat sink 20. As illustrated in FIGS. 5 and 6, the cooling air V flowing through the ventilation path 26 is blown out from the plurality of the air outlets 28.

Heat Conduction Portion

As illustrated in FIG. 3, the plurality of the heat conduction portions 30 are formed in a rectangular parallelepiped shape. The plurality of the heat conduction portions 30 are arranged at equal intervals in the lateral width direction (arrow X direction) and the longitudinal width direction (arrow Y direction) of the heat sink 20 in the ventilation path 26. By these heat conduction portions 30, the heat receiving base portion 22 and the fin base portion 24 are heat exchangeably (thermally) connected to each other. For example, the heat receiving base portion 22 and the fin base portion 24 are connected so as to be heat exchangeable via a plurality of the heat conduction portions 30.

As illustrated in FIG. 4, the plurality of the heat conduction portions 30 are arranged only between the air outlets 28 adjacent to each other as viewed in the thickness direction of the fin base portion 24. As a result, the air outlet 28 is suppressed from being partially blocked by the heat conduction portion 30. The plurality of the heat conduction portions 30 are arranged at regular intervals between the air outlets 28 adjacent to each other as viewed in the thickness direction of the fin base portion 24. As a result, the heat of the electronic component 12 is evenly dispersed and transmitted from the heat receiving base portion 22 to the fin base portion 24.

The shape, arrangement, and the number of the heat conduction portions 30 may be appropriately changed. The heat conduction portion 30 may be integrally formed with the heat receiving base portion 22 or the fin base portion 24.

Radiation Fin

As illustrated in FIG. 3, a plurality (three or more) of the radiation fins 40 are formed in a rectangular plate shape. The plurality of the radiation fins 40 have the same shape and size as each other. These radiation fins 40 extend from the fin base portion 24 to the side opposite to the heat receiving base portion 22. The plurality of the radiation fins 40 are joined to the fin base portion 24 by welding or the like.

The plurality of radiation fins 40 are arranged along the lateral width direction (arrow X direction) of the fin base portion 24. The plurality of the radiation fins 40 are arranged from one end side to the other end side in the lateral width direction of the fin base portion 24. The plurality of the radiation fins 40 are arranged at intervals in the longitudinal width direction (arrow Y direction) of the heat sink 20. The longitudinal width direction of the heat sink 20 is an example of a predetermined direction.

The shape and size of the plurality of the radiation fins 40 may be different from each other.

As illustrated in FIGS. 4, 5, and 6, a gap (air path) 42 is formed between the radiation fins 40 adjacent to each other. The gap 42 and the ventilation path 26 are connected to each other via the air outlet 28.

As illustrated in FIG. 4, the plurality of the radiation fins 40 intersect the plurality of the air outlets 28 as viewed in the thickness direction (arrow Z direction) of the fin base portion 24. For example, the plurality of the radiation fins 40 cross the plurality of the air outlets 28 as viewed in the thickness direction of the fin base portion 24. As a result, a portion of the plurality of the air outlets 28 is arranged in the gap 42 between the radiation fins 40 adjacent to each other. These air outlets 28 are arranged at equal intervals over the entire length in the width direction (arrow X direction) of the radiation fins 40.

Figure 7:
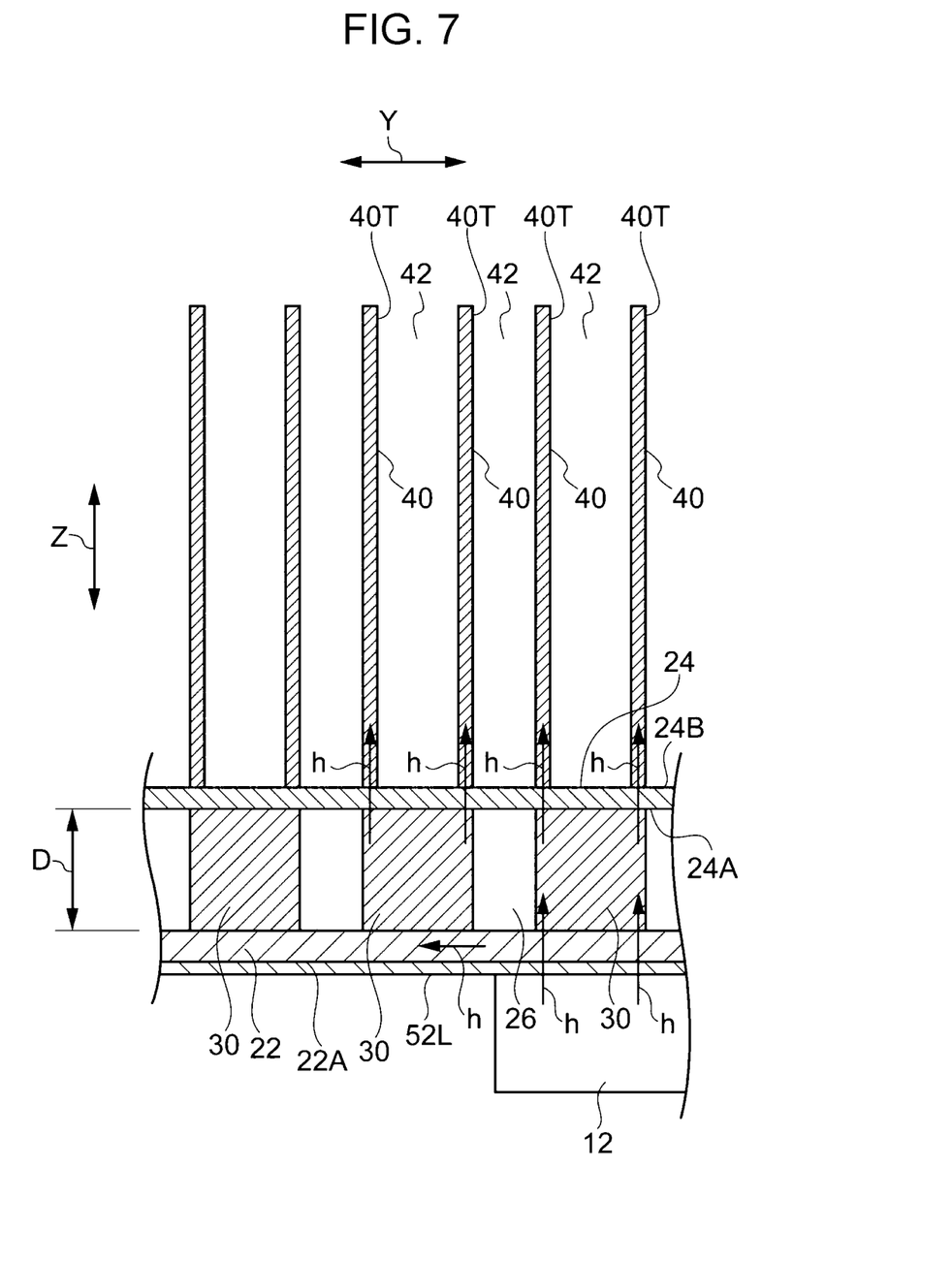
FIG. 7 is a cross-sectional view taken along line VII-VII of FIG. 4.

As illustrated in FIG. 4 and FIG. 7, the radiation fins 40 overlap the plurality of the heat conduction portions 30 as viewed in the thickness direction (arrow Z direction) of the fin base portion 24. As a result, heat h of the electronic component 12 is efficiently transmitted from the heat receiving base portion 22 to the radiation fin 40 via the plurality of the heat conduction portions 30.

Case

As illustrated in FIG. 1, the heat sink 20 is accommodated in a case 50. The case 50 includes a case main body 52, an intake side cover 62, and an exhaust side cover 66. The case main body 52 is formed in a box shape.

The case main body 52 includes a bottom wall portion 52L, a top wall portion 52T, a pair of side wall portions 52S, an intake side wall portion 52F, and an exhaust side wall portion 52R. The bottom wall portion 52L is placed on the electronic component 12 (illustrated in FIG. 2). The bottom wall portion 52L and the top wall portion 52T face each other in the height direction of the heat sink 20. The bottom wall portion 52L and the top wall portion 52T are connected to each other via the pair of side wall portions 52S.

The pair of side wall portions 52S face each other in the longitudinal width direction of the heat sink 20. On the other hand, the intake side wall portion 52F and the exhaust side wall portion 52R face each other in the lateral width direction of the heat sink 20. An intake port 54 is formed on the side of the bottom wall portion 52L of the intake side wall portion 52F. An exhaust port 56 is formed on the side of the top wall portion 52T of the exhaust side wall portion 52R. The exhaust port 56 is disposed on the side opposite to the intake port 54 with respect to the case main body 52.

As illustrated in FIG. 2, the heat sink 20 is accommodated inside the case main body 52. The heat receiving base portion 22 of the heat sink 20 is overlapped on the bottom wall portion 52L of the case main body 52 in a state of being accommodated in the case main body 52. As a result, the heat of the electronic component 12 is transmitted to the heat receiving base portion 22 of the heat sink 20 via the bottom wall portion 52L of the case 50.

The ventilation path 26 of the heat sink 20 is partitioned by the pair of side wall portions 52S and the exhaust side wall portion 52R of the case main body 52. The intake port 54 of the case main body 52 is disposed on the bottom wall portion 52L side from the fin base portion 24 of the heat sink 20. The intake port 54 leads to the ventilation path 26 of the heat sink 20.

The pair of side wall portions 52S and the exhaust side wall portion 52R of the case main body 52 are an example of a partition wall portion that partitions the ventilation path 26.

The top wall portion 52T side of the case main body 52 from the fin base portion 24 is a fin storage portion 58 having the exhaust port 56. The fin base portion 24 accommodates a plurality of the radiation fins 40. An air path 60 is formed between a tip end portion 40T of the radiation fin 40 and the top wall portion 52T.

The intake side cover 62 is attached to the intake port 54 side of the case main body 52. The intake side cover 62 covers the intake port 54. An end portion of an intake pipe 64 is connected to the intake side cover 62. The intake pipe 64 is formed, for example, in a cylindrical shape. The end portion of the intake pipe 64 is disposed to face the intake port 54 of the case main body 52.

A high static pressure air generator (not illustrated) is connected to the intake pipe 64. The high static pressure air generator has a fan or the like, and for example, generates air having a static pressure of 4.0 kilopascal (kPa) or more (hereinafter, referred to as "cooling air V"). The cooling air V is supplied from the intake pipe 64 to the ventilation path 26 of the heat sink 20 via the intake port 54.

The exhaust side cover 66 is attached to the exhaust port 56 side of the case main body 52. The exhaust side cover 66 covers the exhaust port 56. An end portion of an exhaust pipe 68 is connected to the exhaust side cover 66. The exhaust pipe 68 is formed, for example, in a cylindrical shape. The end portion of the exhaust pipe 68 is disposed to face the exhaust port 56 of the case main body 52. The cooling air V discharged from the exhaust port 56 of the case main body 52 is exhausted via the exhaust pipe 68.

Operation

Next, an operation of the embodiment will be described.

As illustrated in FIG. 2, the cooling device 10 is attached to the electronic component 12. In this state, the bottom wall portion 52L of the case 50 of the cooling device 10 is heat exchangeable with the electronic component 12. As a result, as illustrated in FIG. 7, the heat h of the electronic component 12 is transmitted from the bottom wall portion 52L of the case 50 to the heat receiving base portion 22 of the heat sink 20. The heat h of the electronic component 12 transmitted to the heat receiving base portion 22 is transmitted to the fin base portion 24 and the plurality of the radiation fins 40 via the plurality of the heat conduction portions 30.

The plurality of the heat conduction portions 30 are arranged between the heat receiving base portion 22 and the fin base portion 24. As a result, in the present embodiment, since the heat transmitting path of the heat h from the electronic component 12 is increased, the heat h is efficiently transmitted to the radiation fin 40. Therefore, the cooling efficiency of the electronic component 12 is enhanced.

As illustrated in FIG. 4, the heat conduction portion 30 is arranged between the air outlets 28 adjacent to each other as viewed in the thickness direction of the fin base portion 24. As a result, it is suppressed that the heat from the heat conduction portion 30 is partially blocked by the fin base portion 24.

The plurality of the heat conduction portions 30 are arranged at equal intervals between the air outlets 28 adjacent to each other as viewed in the thickness direction of the fin base portion 24. As a result, the heat of the electronic component 12 is uniformly dispersed and transmitted to the radiation fins 40 via the plurality of the heat conduction portions 30. Therefore, the cooling efficiency of the electronic component 12 is further enhanced.

However, as illustrated in FIG. 7, the heat conduction portion 30 overlaps the radiation fins 40 as viewed in the thickness direction (arrow Z direction) of the fin base portion 24. As a result, in the present embodiment, as viewed in the thickness direction of the fin base portion 24, the heat h of the electronic component 12 is efficiently transmitted from the heat conduction portion 30 to the radiation fin 40, as compared with a case where the heat conduction portion 30 does not overlap the radiation fins 40. Therefore, the cooling efficiency of the electronic component 12 is further enhanced.

Next, when the high static pressure air generator operates, as illustrated in FIG. 2, the cooling air V is supplied from the intake pipe 64 to the ventilation path 26 of the heat sink 20 via the intake port 54. As illustrated in FIG. 6, the cooling air V supplied to the ventilation path 26 is supplied to the gap 42 between the radiation fins 40 adjacent to each other via the plurality of the air outlets 28 formed in the fin base portion 24. The plurality of the radiation fins 40 are respectively cooled due to the cooling air V. For example, heat radiation of the plurality of the radiation fins 40 is promoted due to the cooling air V.

As illustrated in FIG. 2, the cooling air V passing through the gap 42 between the radiation fins 40 adjacent to each other flows along the air path 60 on the side of the top wall portion 52T of the case 50 and is discharged from the exhaust port 56 to the outside of the case 50 via the exhaust pipe 68.

As described above, in this embodiment, the cooling air V supplied to the ventilation path 26 is supplied to the gaps 42 between the radiation fins 40 adjacent to each other via the plurality of the air outlets 28 formed in the fin base portion 24, respectively. For example, in the present embodiment, the cooling air V may be supplied to all of the plurality of the radiation fins 40. Therefore, the cooling efficiency of the plurality of the radiation fins 40 may be enhanced.

The plurality of the air outlets 28 are arranged in the gap 42 between the radiation fins 40 adjacent to each other. As a result, in the present embodiment, the radiation fin 40 may be cooled over a wide range due to the cooling air V, as compared with a case where one air outlet 28 is disposed in the gap 42 between the radiation fins 40 adjacent to each other.

The plurality of the air outlets 28 are arranged at equal intervals (dispersed) over the entire length in the width direction (arrow X direction) of the radiation fin 40. As a result, the radiation fin 40 may be more efficiently cooled due to the cooling air V.

Referring to FIGS. 2 and 4, the plurality of the radiation fins 40 intersect the plurality of the air outlets 28 as viewed in the thickness direction of the fin base portion 24. As a result, it is possible to easily arrange the plurality of the air outlets 28 in the gap 42 between the radiation fins 40 adjacent to each other.

When the cooling air V passes through the gap 42 between the radiation fins 40 adjacent to each other, the temperature rises. The cooling air V is discharged from the exhaust port 56 to the exhaust pipe 68 along the air path 60 of the fin storage portion 58. As a result, it is possible to reduce the influence of the cooling air V having the increased temperature on other electronic components in the vicinity of the electronic component 12.

The exhaust port 56 is disposed on the side opposite to the intake port 54 with respect to the case 50 (fin storage portion 58). As a result, the cooling air V easily flows inside the case 50. Therefore, the cooling efficiency of the radiation fin 40 due to cooling air V is enhanced.

As illustrated in FIG. 7, when a distance D between the heat receiving base portion 22 and the fin base portion 24 becomes narrower, the heat transmission efficiency of the electronic component 12 transmitted from the heat receiving base portion 22 to the fin base portion 24 may be enhanced. On the other hand, as illustrated in FIGS. 5 and 6, when the distance D between the heat receiving base portion 22 and the fin base portion 24 becomes narrower, the pressure loss when the cooling air V flows through the ventilation path 26 increases. In this case, it is difficult for the cooling air V to flow through the ventilation path 26, and there is a possibility that the cooling efficiency of the radiation fin 40 is lowered.

On the other hand, as illustrated in FIG. 2, in the present embodiment, the high static pressure air generator is connected to the ventilation path 26 via the intake pipe 64. Due to the high static pressure air generator, it is possible to increase the static pressure of the cooling air V according to the pressure loss of the ventilation path 26. Therefore, even when the distance D between the heat receiving base portion 22 and the fin base portion 24 is narrow, the cooling air V may flow through the ventilation path 26.

As described above, since the cooling device 10 of the present embodiment includes the high static pressure air generator, it is possible to supply the cooling air V to the plurality of the radiation fins 40 while increasing the heat transmission efficiency of the electronic component 12 transmitted from the heat receiving base portion 22 to the fin base portion 24. Therefore, the cooling efficiency of the electronic component may be enhanced.

By generating the cooling air V by the high static pressure air generator, the cooling air V may flow through the intake pipe 64 and the exhaust pipe 68 even in a case where the diameters of the intake pipe 64 and the exhaust pipe 68 are small. Therefore, the installation space of the intake pipe 64 and the exhaust pipe 68 may be reduced.

Electronic Apparatus

Next, an electronic apparatus on which the cooling device 10 is mounted will be described.

Figure 8:
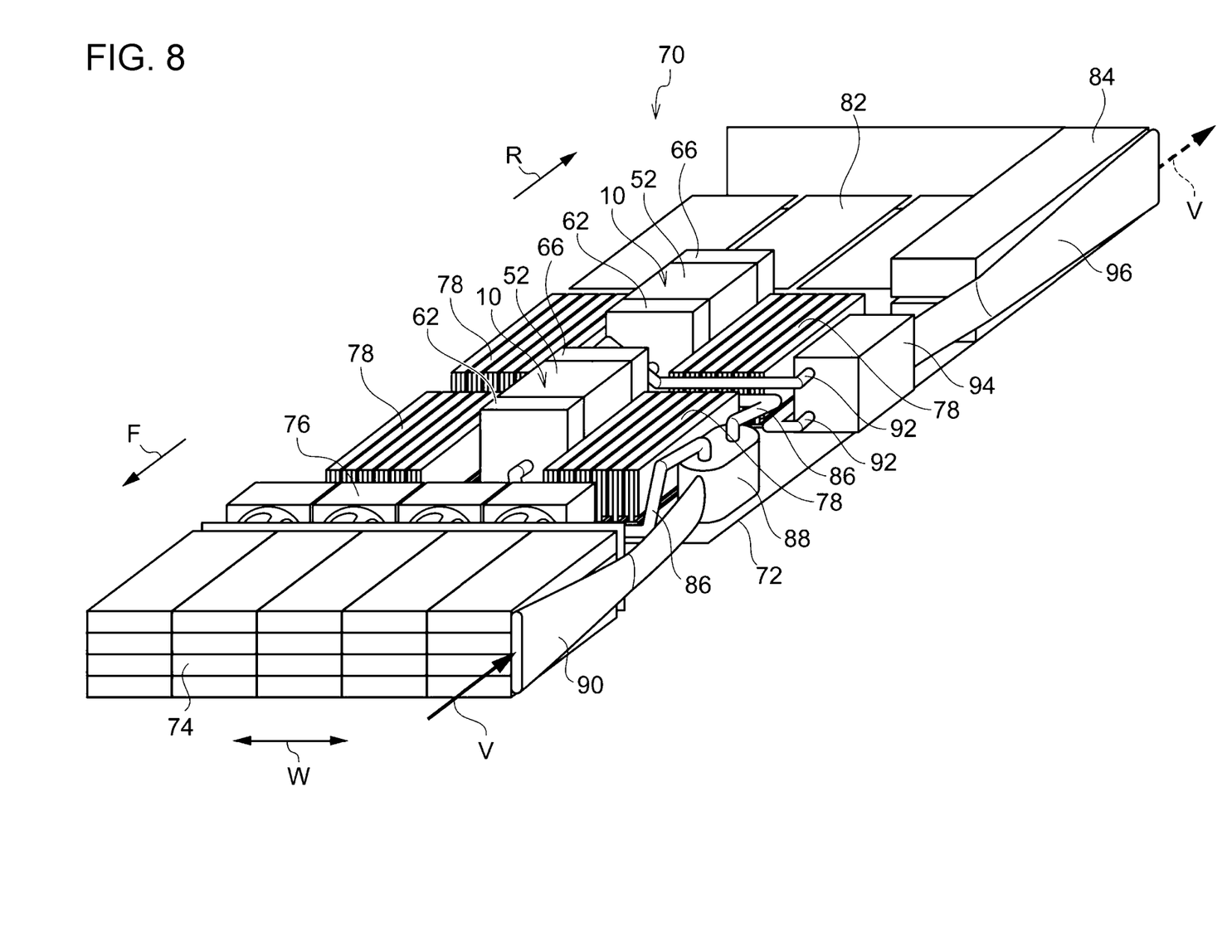
FIG. 8 is a perspective view illustrating an electronic apparatus on which the cooling device illustrated in FIG. 1 is mounted.
Figure 9:
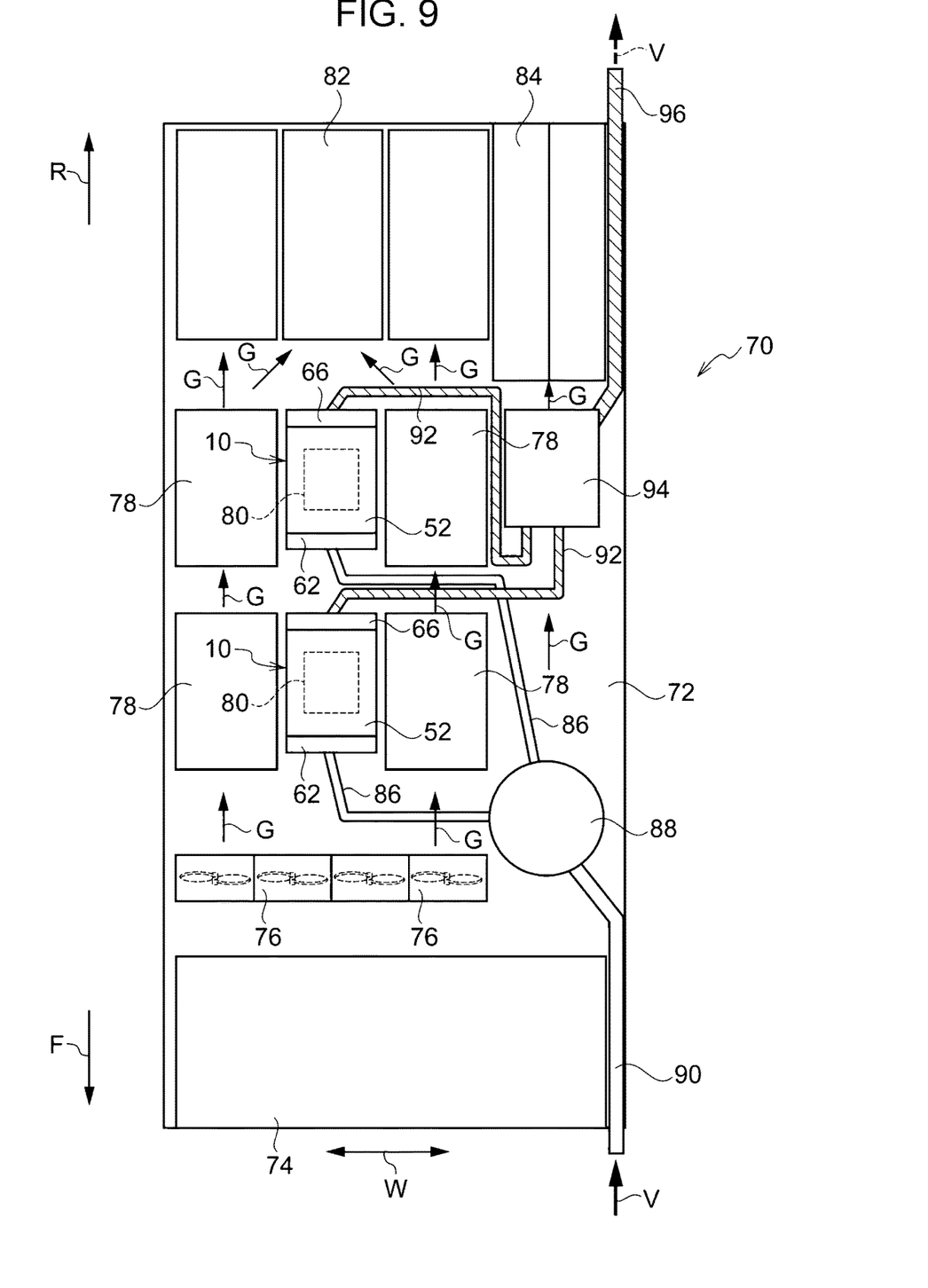
FIG. 9 is a plan view illustrating the electronic apparatus illustrated in FIG. 8.

In FIGS. 8 and 9, an electronic apparatus 70 on which the cooling device 10 is mounted is illustrated. The electronic apparatus 70 is, for example, a rack mount type server accommodated in a rack (not illustrated). The electronic apparatus 70 is provided with a housing 72, a plurality of storage devices 74, a plurality of cooling fans 76, a plurality of memories 78, a plurality of CPUs 80, a plurality of input and output cards (I/O cards) 82, and a plurality of power supply units 84.

An arrow W illustrated in FIGS. 8 and 9 indicates a width direction of the electronic apparatus 70 (housing 72). An arrow F indicates a front side of the electronic apparatus 70 (housing 72). An arrow R indicates a rear side of the electronic apparatus 70 (housing 72).

The plurality of the storage devices 74 are, for example, hard disk drives (HDDs). The plurality of the storage devices 74 are accommodated on the front surface side of the housing 72. The plurality of the storage devices 74 are arranged in the lateral width direction of the housing 72. A plurality of the cooling fans 76 are arranged on the rear side (arrow R side) of these storage devices 74.

The plurality of the cooling fans 76 are arranged in the width direction of the housing 72. Each of the cooling fans 76 is, for example, an axial flow fan. Each of the cooling fans 76 generates cooling air G flowing toward the rear side of the housing 72 by operating. The plurality of the memories 78 and the plurality of the CPUs 80 are arranged on the rear side (downstream side of cooling air G) of these cooling fans 76.

The plurality of the memories 78 and the plurality of the CPUs 80 are mounted on a printed board (not illustrated). The plurality of the input and output cards 82 and the plurality of the power supply units 84 are arranged on the rear side (downstream side of cooling air G) of the plurality of the memories 78 and the plurality of the CPUs 80. The plurality of the input and output cards 82 and the plurality of the power supply units 84 are accommodated on the rear surface side of the housing 72.

The plurality of the memories 78, the plurality of the input and output cards 82, and the plurality of the power supply units 84 are cooled by the cooling air G flowing from the plurality of the cooling fans 76. On the other hand, the plurality of the CPUs 80 are cooled by the cooling device 10.

For example, the cooling devices 10 are attached to the plurality of the CPUs 80, respectively. An intake branch pipe 86 is connected to the intake side cover 62 of each cooling device 10. Intake pipes 90 are connected to the plurality of the intake branch pipes 86 via a manifold 88. The intake pipe 90 is disposed along one end portion in the lateral width direction of the housing 72 and is disposed beside the storage device 74. Therefore, it is possible to expand a mounting space of the electronic component and the like on the front surface side of the housing 72.

An exhaust branch pipe 92 is connected to the exhaust side cover 66 of the cooling device 10, respectively. An exhaust pipe 96 is connected to the plurality of the exhaust branch pipes 92 via the high static pressure air generator 94. The high static pressure air generator 94 generates air flowing to the exhaust pipe 96 by operating.

As a result, a negative pressure is generated in the intake pipe 90, as indicated by an arrow V, the air outside the electronic apparatus 70 (cooling air V) is sucked from the intake pipe 90 and supplied to the plurality of the cooling devices 10 via the manifold 88 and the intake branch pipe 86, respectively. The cooling air V discharged from the plurality of the cooling devices 10 is discharged to the outside of the housing 72 via the exhaust branch pipe 92, the high static pressure air generator 94, and the exhaust pipe 96.

When the high static pressure air generator 94 operates, negative pressure is generated in the exhaust branch pipe 92, the cooling device 10, the intake branch pipe 86, the manifold 88, and the intake pipe 90. Therefore, it is preferable that the exhaust branch pipe 92, the cooling device 10, the intake branch pipe 86, the manifold 88, and the intake pipe 90 are tightly sealed so as not to suck air (cooling air G) in the housing 72.

The exhaust pipe 96 is piped along one end portion in the width direction of the housing 72 and is disposed beside the power supply unit 84. Therefore, it is possible to expand the installation space of the electronic component and the like on the rear surface side of the housing 72. The influence of the heat of the cooling air V flowing through the exhaust pipe 96 on the input and output card 82 may be reduced.

The noise of the high static pressure air generator 94 is attenuated by the intake branch pipe 86, the intake pipe 90, the exhaust branch pipe 92, and the exhaust pipe 96. Therefore, the noise of the high static pressure air generator 94 leaking to the outside of the housing 72 is reduced.

The arrangement of the manifold 88 and the high static pressure air generator 94 may be changed. For example, in the electronic apparatus 70 illustrated in FIG. 9, the manifold 88 and the high static pressure air generator 94 may be interchanged with each other. In this case, when the high static pressure air generator operates, a negative pressure is generated in the intake pipe 90. Therefore, it is preferable that the intake pipe 90 is tightly sealed so as not to suck air (cooling air G) in the housing 72.

When the high static pressure air generator operates, positive pressure is generated in the intake branch pipe 86, the cooling device 10, the exhaust branch pipe 92, and the manifold. Therefore, it is preferable that the intake branch pipe 86, the cooling device 10, the exhaust branch pipe 92, and the manifold are tightly sealed so that the cooling air V does not leak into the housing 72.

Figure 10:
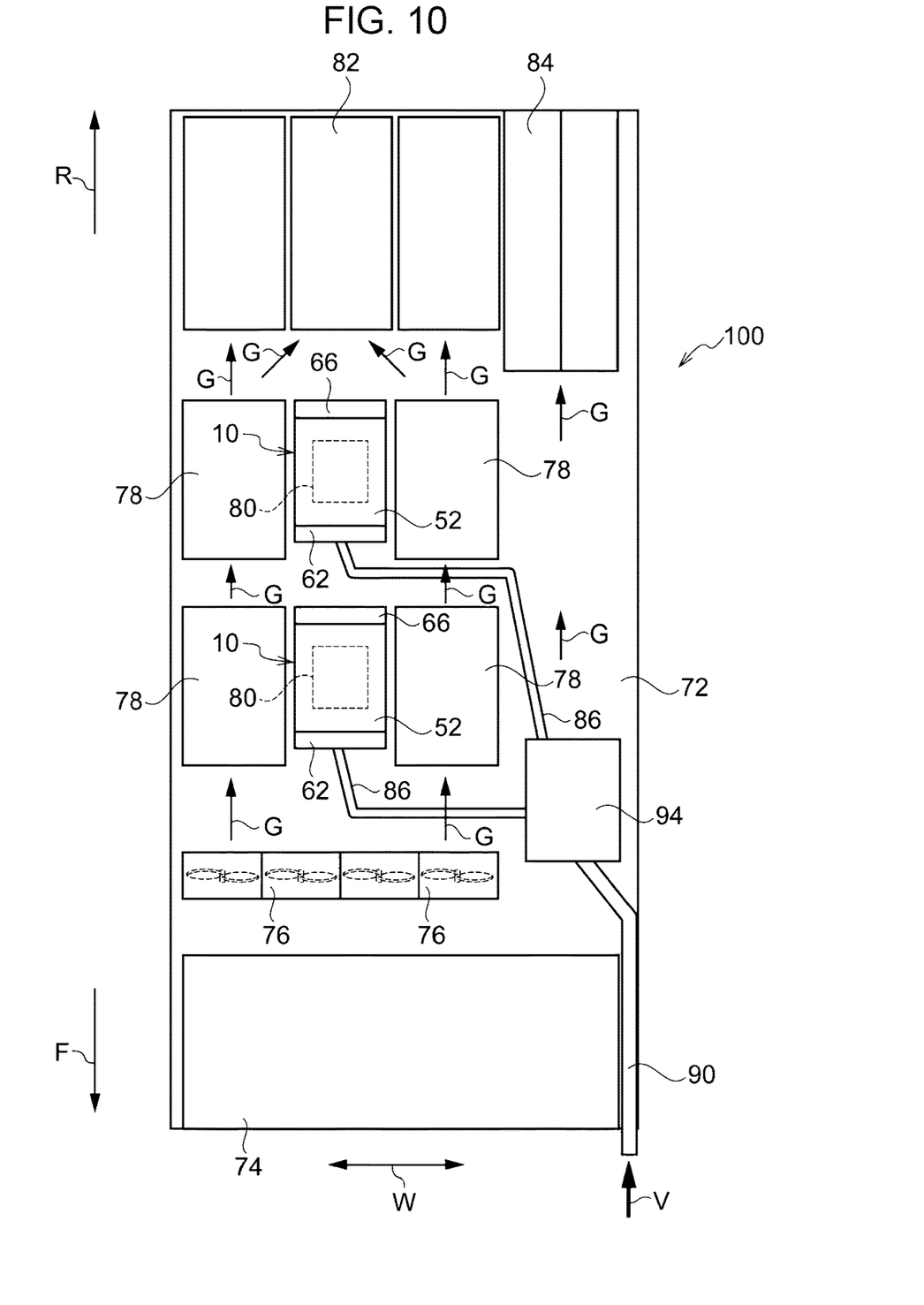
FIG. 10 is a plan view illustrating a modified example of the electronic apparatus illustrated in FIG. 9.

Next, in an electronic apparatus 100 illustrated in FIG. 10, the intake branch pipe 86, the high static pressure air generator 94, and the intake pipe 90 are connected to the respective cooling devices 10. On the other hand, the exhaust branch pipe, the exhaust pipe, and the like are not connected to each of the cooling devices 10, and the cooling air V passing through the cooling device 10 is discharged into the housing 72. In this manner, the exhaust branch pipe and the exhaust pipe may be omitted. In this case, it is possible to expand the mounting space of the electronic component and the like in the housing 72.

Figure 11:
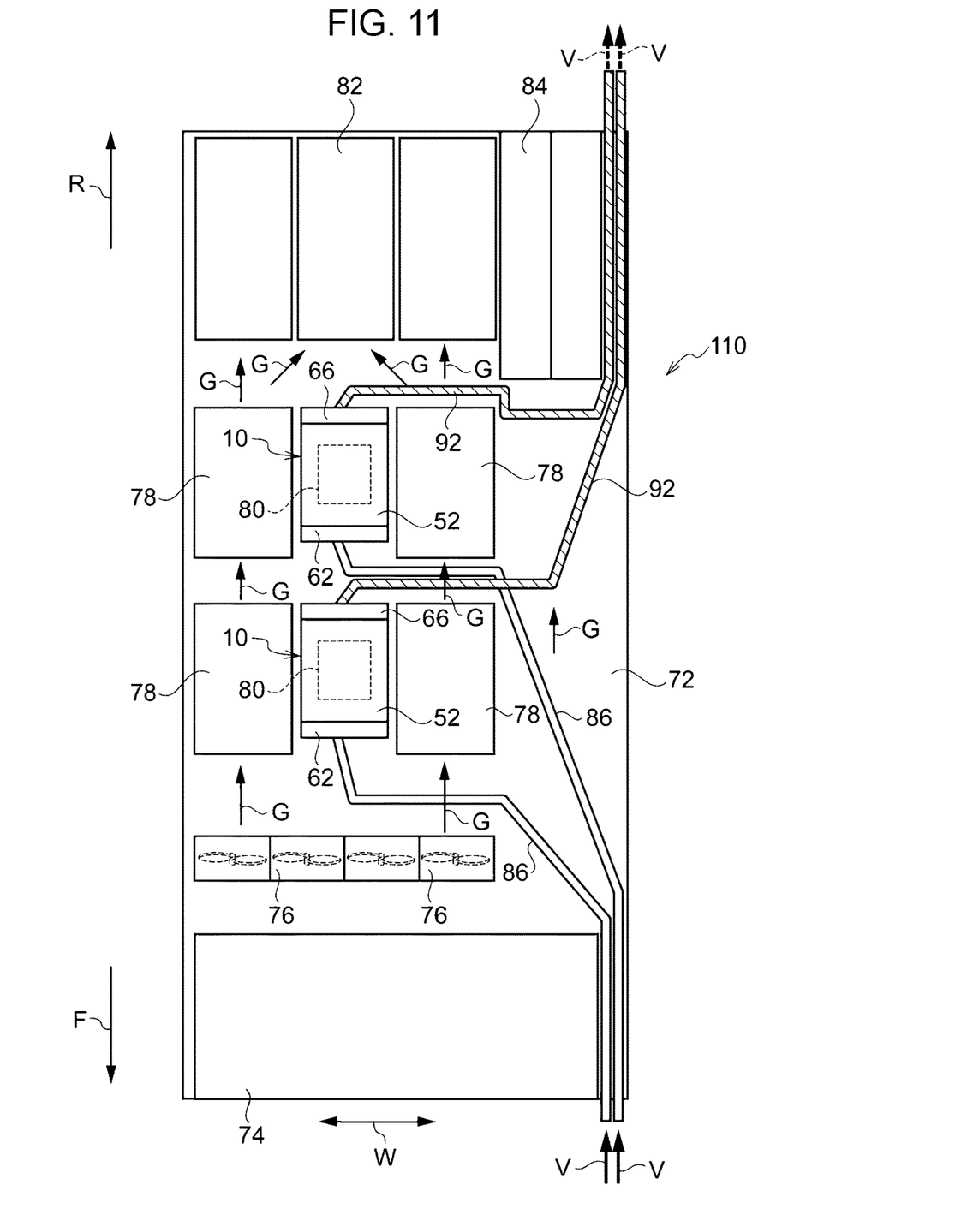
FIG. 11 is a plan view illustrating a modified example of the electronic apparatus illustrated in FIG. 9.

Next, in an electronic apparatus 110 illustrated in FIG. 11, the intake branch pipe 86 is connected to each of the plurality of the cooling devices 10. The plurality of the intake branch pipes 86 are piped along one end portion in the width direction of the housing 72 and disposed beside the storage device 74. To these intake branch pipes 86, a high static pressure air generator (not illustrated) installed outside the housing 72 is connected.

The exhaust branch pipe 92 is connected to each of the plurality of the cooling devices 10. The plurality of the exhaust branch pipes 92 are piped along one end portion in the width direction of the housing 72 and disposed beside the input and output card 82.

As described above, in the electronic apparatus 110, the high static pressure air generator and the manifold are not installed in the housing 72. As a result, the mounting space of the electronic component and the like in the housing 72 may be further expanded.

Modified Example

Next, a modified example of the above embodiment illustrated in FIGS. 1-11 will be described.

In the above embodiment, the air outlet 28 is an elongated hole. However, the shape (circular shape or rectangular shape), arrangement, and the number of the air outlets may be appropriately changed. The air outlet 28 may be formed as an aggregate of a plurality of the fin bases.

In the above embodiment, the plurality of the air outlets 28 are arranged at equal intervals in the gap 42 between the radiation fins 40 adjacent to each other. However, at least one air outlet may be disposed in the gap 42 between the radiation fins 40 adjacent to each other. In the gap 42 between radiation fins 40 adjacent to each other, the air outlet may be disposed at least on both sides and an intermediate portion in the width direction (arrow X direction) of the radiation fins 40.

In the above embodiment, the radiation fins 40 and the air outlet 28 intersect with each other as viewed in the thickness direction of the fin base portion 24. However, for example, the radiation fins and the air outlet may not intersect and may be disposed substantially in parallel as viewed in the thickness direction of the fin base portion 24. The radiation fin 40 may not overlap the heat conduction portion 30 as viewed in the thickness direction of the fin base portion 24. The shape and arrangement of the radiation fin 40 may be appropriately changed.

In the above embodiment, the heat conduction portion 30 is formed in a rectangular parallelepiped shape. However, the heat conduction portion may be cylindrical or tubular, for example.

In the above embodiment, the plurality of the heat conduction portions 30 are arranged at equal intervals between the air outlets 28 adjacent to each other as viewed in the thickness direction of the fin base portion 24. However, at least one heat conduction portion may be disposed between the air outlets 28 adjacent to each other as viewed in the thickness direction of the fin base portion 24. For example, the heat conduction portion and the air outlet may partially overlap each other as viewed in the thickness direction of the fin base portion 24.

In the above embodiment, one intake pipe 64 is connected to the ventilation path 26. However, the plurality of the intake pipes may be connected to the ventilation path 26.

The case 50 of the above embodiment has the fin storage portion 58. However, the fin storage portion 58 may be omitted. The case 50 of the above embodiment has the bottom wall portion 52L. However, the bottom wall portion 52L may be omitted. In a case where the bottom wall portion 52L is omitted, for example, heat is directly transmitted from the electronic component 12 to the heat receiving base portion 22.

In the above embodiment, the arrow X direction is the lateral width direction of the cooling device 10 (heat sink 20), and the arrow Y direction is the longitudinal width direction of the cooling device 10 (heat sink 20). However, the arrow X direction may be the longitudinal width direction of the cooling device 10 (heat sink 20), and the arrow Y direction may be the lateral width direction of the cooling device 10 (heat sink 20).

Although the embodiment of the technology disclosed by the present application has been described above, the technique disclosed by the present application is not limited to the above embodiment. It is a matter of course that the embodiment and various modified examples may be used in combination as appropriate or various embodiments may be performed without departing from the gist of the technology disclosed in the present application.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A cooling device comprising:
   a heat reception base configured to receive heat transmitted from an electronic component;
   a fin base configured to face the heat reception base, and to form a ventilation path through which air flows between the fin base and the heat reception base;
   a heat conduction portion coupled with the heat reception base and the fin base;
   a plurality of radiation fins configured to extend from the fin base to a side opposite to the heat reception base;
   a fin storage that encloses the heat reception base, the heat conduction portion, the fin base, and the plurality of radiation fins, and comprises:
      a first partition wall that defines an intake port at a bottom end of the fin storage so that the heat reception base is at least partially exposed;
      a second partition wall that is provided on a side opposite to the first partition wall and defines an exhaust port at an upper end of the fin storage;
      a cooling air intake pipe provided adjacent the heat reception base and coupled to the intake port via an intake side cover; and
      an exhaust pipe provided on a side opposite the cooling air intake pipe and coupled to the exhaust port via an exhaust side cover,
      the fin base includes an air outlet configured to communicate with a gap between the radiation fins adjacent to each other.

2. The cooling device according to claim 1, wherein the air outlet is coupled with the ventilation path and the gap between the radiation fins adjacent to each other.

3. The cooling device according to claim 1, wherein the air outlet comprises a plurality of air outlets that are arranged in the gap between the radiation fins adjacent to each other.

4. The cooling device according to claim 3, wherein, in the gap between the radiation fins adjacent to each other, the plurality of air outlets are arranged at least on both sides and an intermediate portion in a width direction of the radiation fin.

5. The cooling device according to claim 3, wherein, in the gap between the radiation fins adjacent to each other, the plurality of air outlets are arranged at equal intervals in a width direction of the radiation fins.

6. The cooling device according to claim 1, wherein
   the air outlet is an elongated hole, and
   the radiation fins intersect the air outlet as viewed in a thickness direction of the fin base.

7. The cooling device according to claim 1, wherein the heat conduction portion and the radiation fins overlap each other as viewed in a thickness direction of the fin base.

8. The cooling device according to claim 1, wherein the heat conductor comprises a plurality of heat conductors and the plurality of heat conductors are arranged between the heat reception base and the fin base.

9. The cooling device according to claim 8, wherein the air outlet comprises a plurality of air outlets and the plurality of heat conductors are arranged between the air outlets adjacent to each other as viewed in the thickness direction of the fin base.

10. The cooling device according to claim 1, wherein the air outlet comprises a plurality of air outlets and the heat conduction portion is arranged between the air outlets adjacent to each other as viewed in a thickness direction of the fin base.

11. The cooling device according to claim 1, further comprising: a high static pressure air generator configured to supply air to the ventilation path.

12. The cooling device according to claim 1, wherein the heat reception base, the fin base, the heat conduction portion, and the plurality of radiation fins have thermal conductivity.

13. An electronic apparatus comprising:
    an electronic component: and
    a cooling device configured to include:
    a heat reception base configured to receive heat transmitted from the electronic component,
    a fin base configured to face the heat reception base, and to form a ventilation path through which air flows between the fin base and the heat reception base,
    a heat conduction portion coupled with the heat reception base and the fin base, and
    a plurality of radiation fins configured to extend from the fin base to a side opposite to the heat reception base,
    the fin base includes an air outlet configured to communicate with a gap between the radiation fins adjacent to each other; and
    a fin storage that encloses the heat reception base, the heat conduction portion, the fin base, and the plurality of radiation fins, and comprises:
       a first partition wall that defines an intake port at a bottom end of the fin storage so that the heat reception base is at least partially exposed;
       a second partition wall that is provided on a side opposite to the first partition wall and defines an exhaust port at an upper end of the fin storage,
    a cooling air intake pipe provided adjacent the heat reception base and coupled to the intake port via an intake side cover; and
    an exhaust pipe provided on a side opposite the cooling air intake pipe and coupled to the exhaust port via an exhaust side cover.

14. An electronic component cooling device comprising:
    a heat receiving portion;
    a plurality of heat conduction portions extending from a surface of the heat receiving portion;
    a fin portion including a plurality of air outlets, the fin portion provided on a side of the plurality of heat conduction portions that is opposite the heat receiving portion;
    a plurality of radiation fins extending from a side of the fin portion that is opposite the plurality of heat conduction portions; and
    a case that encloses the heat receiving portion, the plurality of heat conduction portions, the fin portion, and the plurality of radiation fins,
    the case including a first partition wall that defines an intake port at a bottom end of the case so that the heat receiving portion is at least partially exposed; and a second partition wall that is provided on a side opposite to the first partition wall and defines an exhaust port at an upper end of the case, a cooling air intake pipe provided adjacent the heat receiving portion and coupled to the intake port via an intake side cover, and an exhaust pipe provided on the second partition wall opposite the cooling air intake pipe and coupled to the exhaust port via an exhaust side cover.

15. The device of claim 14, wherein the cooling air intake pipe is provided at the lower end of the case.

16. The device of claim 14, wherein the exhaust pipe is provided at the upper end of the case.

17. The device of claim 14 further comprising a high static pressure air generator configured to supply air to the cooling air intake pipe.

* * * * *